(12) United States Patent
Taneya et al.

(10) Patent No.: US 6,618,416 B1
(45) Date of Patent: Sep. 9, 2003

(54) SEMICONDUCTOR LASER

(75) Inventors: Mototaka Taneya, Nara (JP); Kunihiro Takatani, Yamatotakada (JP); Susumu Ohmi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/807,003

(22) PCT Filed: Sep. 9, 1999

(86) PCT No.: PCT/JP99/04922
§ 371 (c)(1),
(2), (4) Date: Jun. 22, 2001

(87) PCT Pub. No.: WO00/21169
PCT Pub. Date: Apr. 13, 2000

(30) Foreign Application Priority Data

Oct. 7, 1998 (JP) .......................... 10-284857

(51) Int. Cl.$^7$ ................................ H01S 5/00
(52) U.S. Cl. ................. 372/46; 372/43; 372/44; 372/45
(58) Field of Search .................. 372/45, 46, 43, 372/44

(56) References Cited

U.S. PATENT DOCUMENTS

| | | | |
|---|---|---|---|
| 4,768,201 A | | 8/1988 | Taneya et al. |
| 4,817,104 A | | 3/1989 | Taneya et al. |
| 4,901,328 A | | 2/1990 | Matsui et al. |
| 5,822,350 A | | 10/1998 | Nishimura et al. |
| 5,892,785 A | * | 4/1999 | Nagai .................. 257/192 |
| 5,932,896 A | | 8/1999 | Sugiura et al. |
| 5,956,361 A | * | 9/1999 | Ikeda et al. ............ 372/45 |
| 6,215,803 B1 | * | 4/2001 | Hata .................... 372/45 |

FOREIGN PATENT DOCUMENTS

| | | |
|---|---|---|
| EP | 0091599 A2 | 10/1983 |
| EP | 0581604 A3 | 2/1994 |
| JP | 63-215091 A | 9/1988 |
| JP | 1-117386 A | 5/1989 |
| JP | 2-180084 A | 7/1990 |
| JP | 9-237933 A | 9/1997 |
| JP | 9-289358 A | 11/1997 |
| JP | 10-135575 A | 5/1998 |

OTHER PUBLICATIONS

H.C. Casey, Jr. and M.B. Panish, "Heterostructure Lasers, Part A: Fundamental Principles", 1978, Academic Press, p. 45.*

* cited by examiner

Primary Examiner—Eddie Lee
Assistant Examiner—Matthew C. Landau
(74) Attorney, Agent, or Firm—Birch, Stewart, Kolasch & Birch, LLP.

(57) ABSTRACT

An InGaAlN-based semiconductor laser device, comprising a first layer of a first conductivity type, an active layer having a smaller forbidden band than that of the first layer, and a second layer of a second conductivity type having a larger forbidden band than that of the active layer. The second layer includes a flat region and a stripe-shaped projecting structure. A stripe-shaped optical waveguide forming layer of the second conductivity type having a larger refractive index than that of the second layer is formed on the stripe-shaped projecting structure. A current-constricting layer of the first conductivity type or of a high resistance is formed for covering a top surface of the flat region of the second layer, a side surface of the projecting structure of the second layer, and a side surface of the optical waveguide forming layer. A difference between a thermal expansion coefficient of the current-constricting layer and a thermal expansion coefficient of the second layer is in the range of $-4\times10^{-9}/°C$ to $+4\times10^{-9}/°C$.

8 Claims, 5 Drawing Sheets

SEMICONDUCTOR LASER

This application is the national phase under 35 U.S.C. §371 of PCT International Application No. PCT/JP99/04922 which has an International filing date of Sep. 9, 1999, which designated the United States of America.

TECHNICAL FIELD

The present invention relates to a semiconductor laser device, and in particular to a semiconductor laser device formed of InGaAlN-based materials.

BACKGROUND ART

InGaAlN-based materials are used for emitting blue to green light. Specifically, there have been attempts to apply a refractive index waveguide-type InGaAlN-based semiconductor laser device for an optical disk pickup since this type of semiconductor laser device emits light which is close to a plane wave and thus can reduce an astigmatic difference.

FIG. 4 shows a structure of a conventional refractive index waveguide-type blue semiconductor laser device 450. The conventional device 450 includes a sapphire substrate 400 and the following layers sequentially formed on the sapphire substrate 400: an n-type GaN contact layer 401, an n-type $Al_{0.1}Ga_{0.9}N$ cladding layer 402 having a thickness of 0.5 μm, an n-type GaN optical guide layer 403 having a thickness of 100 nm, a multi-layer quantum well active layer 404 which includes three $In_{0.2}Ga_{0.8}N$ quantum well layers each having a thickness of 2.5 nm and four $In_{0.05}Ga_{0.95}N$ barrier layers each having a thickness of 3 nm, an $Al_{0.1}Ga_{0.9}N$ protective layer 405 having a thickness of 25 nm, a p-type GaN optical guide layer 406 having a thickness of 50 nm, a p-type $Al_{0.1}Ga_{0.9}N$ cladding layer 407 having a total thickness of 0.6 μm which includes a lower flat region 410 having a thickness of 0.1 μm and a ridge stripe portion 411 having a width of 2 μm and a height of 0.5 μm, and a p-type GaN contact layer 408 having a width of 2 μm and a thickness of 0.2 μm. The p-type GaN contact layer 408 is formed on the ridge stripe portion 411 of the p-type cladding layer 407. An $SiO_2$ insulating layer 409 having a thickness of 0.3 μm and a smaller refractive index than that of the ridge stripe portion 411 is formed so as to cover a top surface of the lower flat region 410 of the p-type cladding layer 407 and side surfaces of the ridge stripe portion 411. An n-type electrode 413 is formed on an exposed surface of the n-type GaN contact layer 401, and a p-type electrode 414 is formed on a surface of the p-type contact layer 408 on the ridge stripe portion 411. In the figure, reference numeral 412 represents ridge corners.

In the conventional semiconductor laser device 450, the refractive index of the $SiO_2$ insulating layer 409 is smaller than the refractive index of the InGaAlN materials, and therefore the effective refractive index of the outside of the ridge is reduced, so that laser light is guided to the ridge region and the vicinity thereof.

The conventional InGaAlN-based semiconductor Ilaser device 450 was subjected to a reliability test under the conditions of 60° C. and a constant output of 5 mW. The value of the operating current increased to 1.2 times or more the initial value, and the device 450 malfunctioned within 100 hours. Accordingly, the conventional semiconductor laser device is considered to have a life of about 100 hours. It was found that a life of 5000 hours or more, which is necessary for a semiconductor laser device used for an optical disk apparatus, cannot be realized.

The laser device before the reliability test and the laser device which malfunctioned during the reliability test were compared and analyzed. As a result, the post-malfunction laser device was observed to have crystal defects increased in the ridge corner areas 412 (both ends of the base of the ridge stripe portion 411 and the vicinity thereof). The present inventors found that in accordance with the increase in the crystal defects, the emission efficiency drastically declines in areas of the multi-layer quantum well active layer 404 which are contained in the ridge corner areas 412, and this is the main cause of reduction In the life of the conventional device 450. In the conventional device having the above-described structure, the crystal defect density of the post-malfunction ridge corner areas 412 was $6\times10^{11}$ to $8\times10^{11}$ $cm^{-2}$, which was higher than that of the defect density of the remaining area (3 to $7\times10^{10}$ $cm^{-2}$) by one order of magnitude.

The decline in the reliability due to the increase in the crystal defects is considered to be caused by the strong inter-atom bond of the InGaAlN-based crystal itself and by a large difference between the thermal expansion coefficient of the material forming the ridge stripe portion 411 (p-type $Al_{0.1}Ga_{0.9}N$ cladding layer 407; $5.6\times10^{-6}/°$ C.) and the thermal expansion coefficient of the material surrounding the bottom portion of the ridge stripe portion 411 ($SiO_2$ insulating layer 409; $0.5\times10^{-6}/°$ C.), the difference being as large as $+5.1\times10^{-6}/°$ C. In other words, when the conventional device 450 which has such a large difference in the thermal expansion coefficient between the two materials is made conductive, heat is generated In the ridge stripe portion 411 and the vicinity thereof where the current is concentrated, and thus the temperature is raised locally. It Is considered that the crystal defeat and crystal breakage occurred for the following reason. When the local temperature rise occurs in the InGaAlN-based crystal of the above-described structure, thermal distortion is induced at the ridge corner areas 412 by the difference in the thermal expansion coefficient between the p-type $Al_{0.1}Ga_{0.9}N$ cladding layer 407 forming the ridge stripe portion 411 and the $SiO_2$ insulating layer 409 surrounding the ridge stripe portion 411. The crystal defeat and crystal breakage started from the ridge corner areas 412. Such a phenomenon, which was not observed with InGaAlAs-based materials or InGaAlP-based materials which were conventionally laser used for ridge stripe-type laser devices, was specific to an InGaAlN-based (nitride-based) semiconductor device having a strong bond between a group III atom and a nitrogen atom.

DISCLOSURE OF THE INVENTION

A semiconductor laser device according to the present invention Is an InGaAlN-based semiconductor laser device including a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure; a stripe-shaped optical waveguide forming layer of the second conductivity type having a larger refractive index than that of the second layer is formed on the stripe-shaped projecting structure; a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the current-constricting layer and a thermal expansion coefficient of the second layer is in the range of $-4\times10^{-9}/°$ C. to $+4\times10^{-7}/°$ C.

Due to such a structure, even when the temperature of the device is locally increased in the stripe-shaped projecting structure and the vicinity thereof in which the current is injected in a concentrated manner, the thermal distortion of the device is suppressed owing to the small difference in the thermal expansion coefficient between the current-constricting layer and the second conductive layer. Therefore, a local crystal defect or crystal breakage is avoided, thus extending the life of the laser device.

In one embodiment of the invention, the second layer and the current-constricting layer are formed of an InGaAlN-based semiconductor material of the same composition. For example, the second layer may be formed of $Al_xGa_{1-x}N$, and the current-constricting layer may be formed of $Al_yGa_{1-y}N$, ($-0.08 \leq x-y \leq 0.08$). In an alternative embodiment of the present invention, the optical waveguide forming layer is formed of $In_uGa_{1-u}N$, and u is 0.02 or more and is 90% or less of an In-mix crystal ratio of a well layer included in the active layer.

Due to such a structure, the thermal expansion coefficient which varies depending on the Al-mix crystal ratio, can be less different between the current-constricting layer and the second layer, and thus the thermal distortion of the device can be reduced. By forming the optical waveguide forming layer of $In_uGa_{1-u}N$, the refractive Index of the optical waveguide forming layer can be higher than that of the flat region of the second layer on which the current-constricting layer is formed. This way, a laser device stably oscillating in a single transverse mode up to a high output can be obtained. In addition, the wavefront of the output laser beam is substantially plane and the astigmatic difference can be reduced.

Furthermore in one embodiment of the present invention, the second layer or the current-constricting layer is formed of a super-lattice structure, and the second layer and the current-constricting layer have the same average mix crystal ratio. In one embodiment of the present invention, an InGaAlN layer included in the super-lattice structure has a thickness of 50 nm or less.

Due to such a structure, the thermal expansion coefficients of the second conductive layer and the current-constricting layer are substantially the same, and thus the crystal deterioration at the ridge corners is suppressed. Therefore, the life of the laser device can be extended. By forming the layer having the super-lattice structure to have a thickness of 50 nm or less, the influence of the super-lattice layer on the ridge corner areas 112 can be considered based on the average composition of the super-lattice structure.

BEST MODE FOR CARRYING OUT THE INVENTION

Example 1

Figure 1:
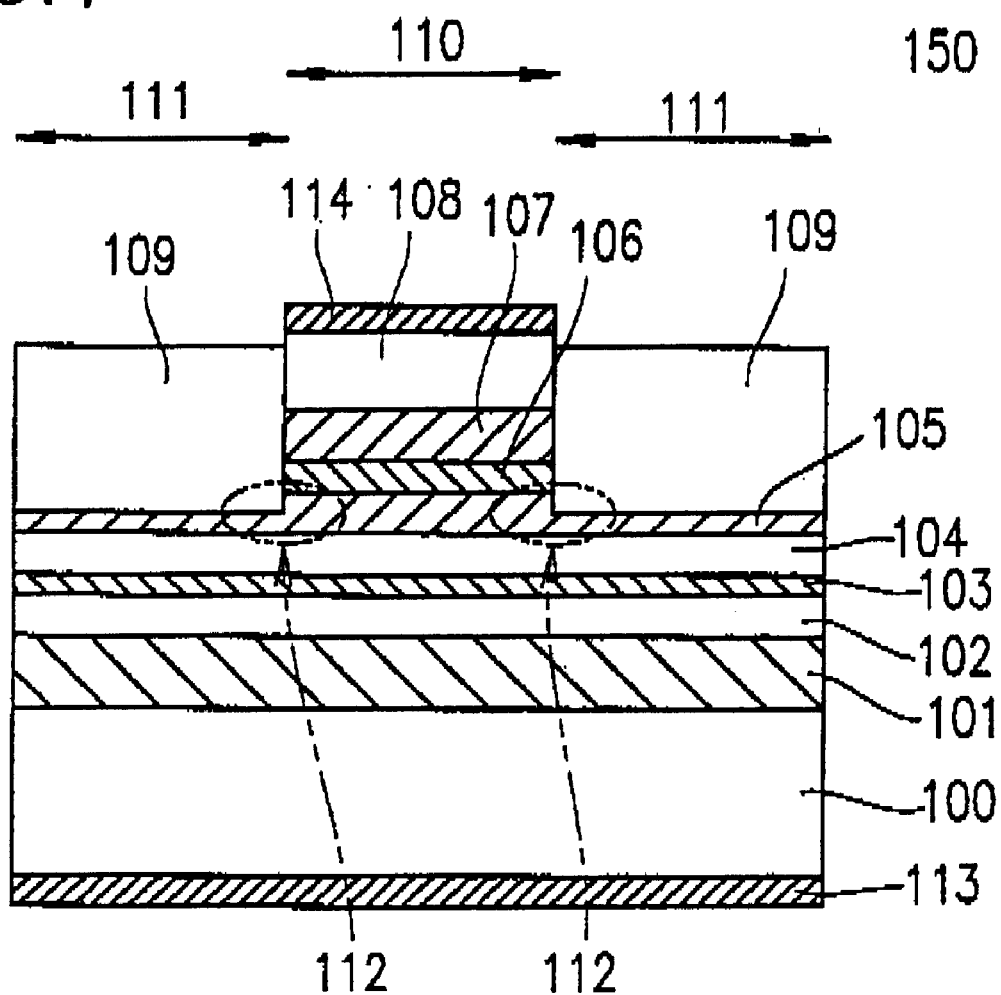
FIG. 1 is a structural view of a device in an example according to the present invention.

A first example according to the present invention will be described with reference to FIG. 1. A laser device 150 in this example includes an n-type GaN substrate 100 and the following layers sequentially formed on the n-type GaN substrate 100: an n-type $Al_{0.1}Ga_{0.9}N$ cladding layer 101 having a thickness of 0.5 µm, an n-type GaN optical guide layer 102 having a thickness of 50 nm, a multi-layer quantum well active layer 103 which includes three $In_{0.2}Ga_{0.8}N$ quantum well layers each having a thickness of 2 nm and four $In_{0.05}Ga_{0.95}N$ barrier layers each having a thickness of 3 nm, an $Al_{0.1}Ga_{0.9}N$ protective layer (not shown) having a thickness of 25 nm, a p-type GaN optical guide layer 104 having a thickness of 50 nm, a p-type $Al_{0.1}Ga_{0.9}N$ lower cladding layer 105 which includes a lower flat region 111 having a thickness of 0.1 µm to 0.3 µm and a ridge stripe portion 110 having a width of 2 µm and a height of 0.3 µm to 0.1 µm, a p-type $In_{0.1}Ga_{0.9}N$ optical waveguide forming layer 106 having a thickness of 0.15 µm, a p-type $Al_{0.1}Ga_{0.9}N$ upper cladding layer 107 having a thickness of 0.2 µm, a p-type GaN contact layer 108 having a thickness of 0.5 µm, and an n-type $Al_{0.1}Ga_{0.9}N$ current-constricting layer 109 having a thickness of 0.8 µm formed so as to embed the ridge stripe portion 110 therein. An n-type electrode 113 is formed on a bottom surface of the n-type GaN substrate 100, and a p-type electrode 114 is formed on a top surface of the p-type GaN contact layer 108.

A method for producing the laser device 150 in this example will be described. On the n-type GaN substrate 100, the n-type $Al_{0.1}Ga_{0.9}N$ cladding layer 101, the n-type GaN optical guide layer 102, the multi-layer quantum well active layer 103, the $Al_{0.1}Ga_{0.9}N$ protective layer (not shown), the p-type GaN optical guide layer 104, the p-type lower cladding layer 105 having a thickness of 0.4 µm, the p-type optical waveguide forming layer 106, the p-type upper cladding layer 107, and the p-type GaN contact layer 108 were continuously grown by an MOCVD technique.

Then, a reactive ion etching (RIE) technique using an $SiO_2$ layer as a mask based on a usual photolithography technique was used to completely remove an area of the p-type GaN contact layer 108, an area of the p-type upper cladding layer 107, and an area of the p-type optical waveguide forming layer 106, the areas corresponding to the lower flat region 111, and also to partially remove an area of the p-type lower cladding layer 105, the area corresponding to the lower flat region 111. Thus, the ridge stripe portion 110 having a width of 2 µm was left. In the laser device 150 in this example, the etching period was adjusted to make the etching depth 1.05 µm. In the etching step, the etching depth was slightly dispersed depending on the position of each device in the wafer. In this example, the etching depth was in the range of 0.95 µm to 1.15 µm. The height of a portion of the p-type lower cladding layer 105 which was processed to have a ridge shape was in the range of 0.1 µm to 0.3 µm. The thickness of a portion of the p-type lower cladding layer in the lower flat region 111 which was not etched was 0.3 µm to 0.1 µm.

Next, the n-type current-constricting layer 109 was formed to a thickness of 0.8 µm by, again, the MOCVD technique while the ridge stripe portion 110 of the wafer was still covered with the $SiO_2$ mask (not shown). In this crystal growth step, single crystal growth of AlGaN was suppressed on the $SiO_2$ layer covering the ridge stripe portion 110. Accordingly, the n-type current-constricting layer 109 was formed selectively only on the lower flat region 111. Then, the $SiO_2$ layer was removed. Polycrystalline AlGaN may have slightly adhered to the surface of the $SiO_2$ layer, but the polycrystalline AlGaN was completely removed together with the $SiO_2$ layer by the removal step.

Finally, the bottom surface of the n-type GaN substrate 100 was ground and polished until the thickness of the wafer became 50 μm. The n-type electrode 113 was formed on the bottom surface of the n-type GaN substrate, and the p-type electrode 114 was formed on the p-type GaN contact layer 108 of the ridge stripe portion 110. Then. a laser cavity was formed by cleaving, and individual chips were cut out from the wafer by scribing. Thus, laser devices 150 were produced.

The laser devices 150 were subjected to a reliability test under the conditions of 60° C. and 30 mW. The driving current value after 1000 hours passed was about 1.04 times the driving current value immediately after the reliability test was started. The time period until the driving current value reached 1.2 times the initial value, i.e., the estimated life, was 8900 hours. As compared to the conventional device, the reliability was significantly improved. The reason is that in the laser device 150 in this example, the ridge corners 112 which are the borders between the ridge stripe portion 110 and the lower flat region 111 are surrounded by a material having the same thermal expansion coefficient as that of the material forming the ridge corners 112 ($Al_{0.1}Ga_{0.9}N$), i.e., $Al_{0.1}Ga_{0.9}N$ having only the conductive types being inverted to the material of the ridge corners 112. Therefore, even in an operation of the laser device which requires several tens of milliamperes of current to be injected, thermal distortion is not generated in the ridge corners 112 despite some heat generation in the device, and thus proliferation of crystal defects from the ridge corners 112 to the multi-layer quantum well active layer 103 can be suppressed.

Figure 2:
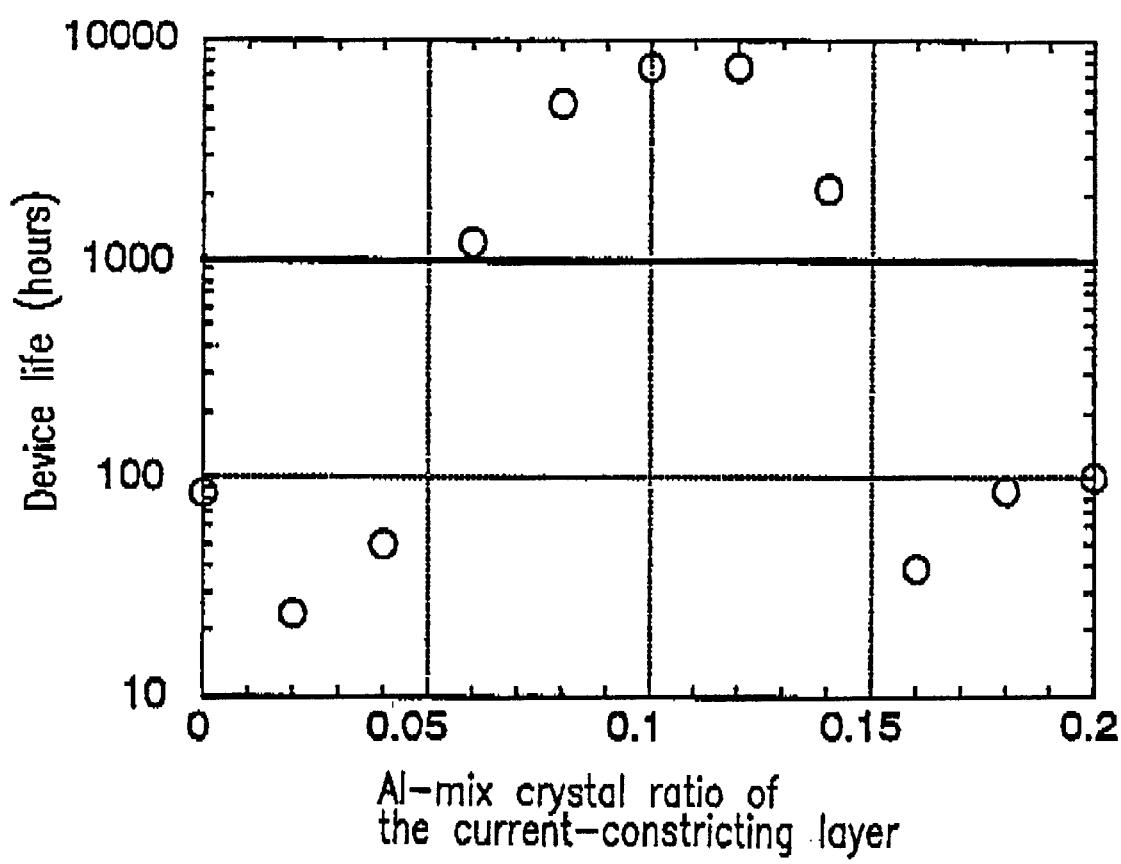
FIG. 2 is a graph illustrating a change In the life of the device of the first example according to the present invention when the mix crystal ratio of the device is changed.

Next, 10 types of laser devices (11 types including the laser device In the above-described example) were produced by a method similar to the method for producing the laser device 150 in the above-described example, with only the Al composition in the n-type current-constricting layer 109 being changed by 0.02 from 0 to 0.08 and 0.12 to 0.2. These laser devices were subjected to a similar reliability test. FIG. 2 shows the life of the laser device with respect to the Al-mix crystal ratio of the n-type current-constricting layer 109 under the conditions of the atmospheric temperature of 60° C. and the optical output of 30 mW. It was found that in the case of the laser devices in which the Al-mix crystal ratio of the n-type current-constricting layer 109 is in the range of 0.06 to 0.14, a life of 1000 hours, which is a minimum necessary life for practical use, or more is guaranteed. It was also found that in the case of the laser devices in which the Al-mix crystal ratio was 0.04 or less, or 0.16 or more, the life of the device is significantly reduced to 500 hours or less. It was found that in order to extend the life of the laser device by reducing the thermal distortion in the ridge areas 112, it is necessary to cover the ridge corners 112 with the n-type current-constricting layer 109 formed of a material having an Al-mix crystal ratio of ±0.04 with respect to $Al_{0.1}Ga_{0.9}N$ forming the p-type lower cladding layer 105 which includes the ridge corners 112 ($Al_{0.06}Ga_{0.94}N$ to $Al_{0.14}Ga_{0.65}N$). It is known that the thermal expansion coefficient of the AlGaN materials tends to increase as the Al-mix crystal ratio increases. Where the Al-mix crystal ratio is x, the thermal expansion coefficient is generally about $5 \times 10^{-6} \times (x)/°$ C. It was found that the difference in the thermal expansion coefficient between the material forming the ridge corners 112 (p-type lower cladding layer 105) and the material covering and embedding the ridge corners 112 (n-type current-constructing layer 109) is preferably in the range of $\pm 2 \times 10^{-9}/°$ C. In this example, $Al_{0.1}Ga_{0.9}N$ was used for the p-type lower cladding layer 105. The Al-mix crystal ratio can be appropriately set in the range of 0.05 or more and 0.3 or less. In this case also, it is clear that the difference between the Al-mix crystal ratio of the p-type lower cladding layer 105 and the Al-mix crystal ratio of the current-constricting layer should be ±0.04, from the fact that the dependency of the thermal expansion coefficient on the Al-mix crystal ratio is substantially linear in this range (i.e., thermal expansion coefficient=$5 \times 10^{-8} \times$Al-mix crystal ratio).

Since the material of the n-type current-constricting layer 109 for embedding the ridge corners 112 is selected on the above-described basis, the refractive index of the p-type lower cladding layer 105 and the refractive index of the p-type upper cladding layer 107 are substantially equal to the refractive index of the n-type current-constricting layer 109. However, in the laser device 150 in this example. an $In_{0.1}Ga_{0.9}N$ layer was used as the p-type optical waveguide forming layer 106. The $In_{0.1}Ga_{0.9}N$ layer is transmissive with respect to light emitted by the multi-layer quantum well active layer 103 and has a larger refractive index than that of the n-type current-constricting layer 109. By forming such a p-type optical waveguide forming layer 106 in the vicinity of the multi-layer quantum well active layer 103 (within the region in which the light emitted by the multi-layer quantum well active layer 103 expands when being waveguided), the effective refractive index of the ridge stripe portion 110 in which the current is concentrated is larger than the refractive index of the lower flat region 111 on which the n-type current-constricting layer 109 is formed. Thus, the laser device in this example is stable in a single transverse mode and can oscillate light at a high output up to 30 mW. The wavefront of the laser beam can be substantially plane, and the astigmatic difference can be suppressed to 3 μm or less, which causes no problem in practical use.

Figure 4:
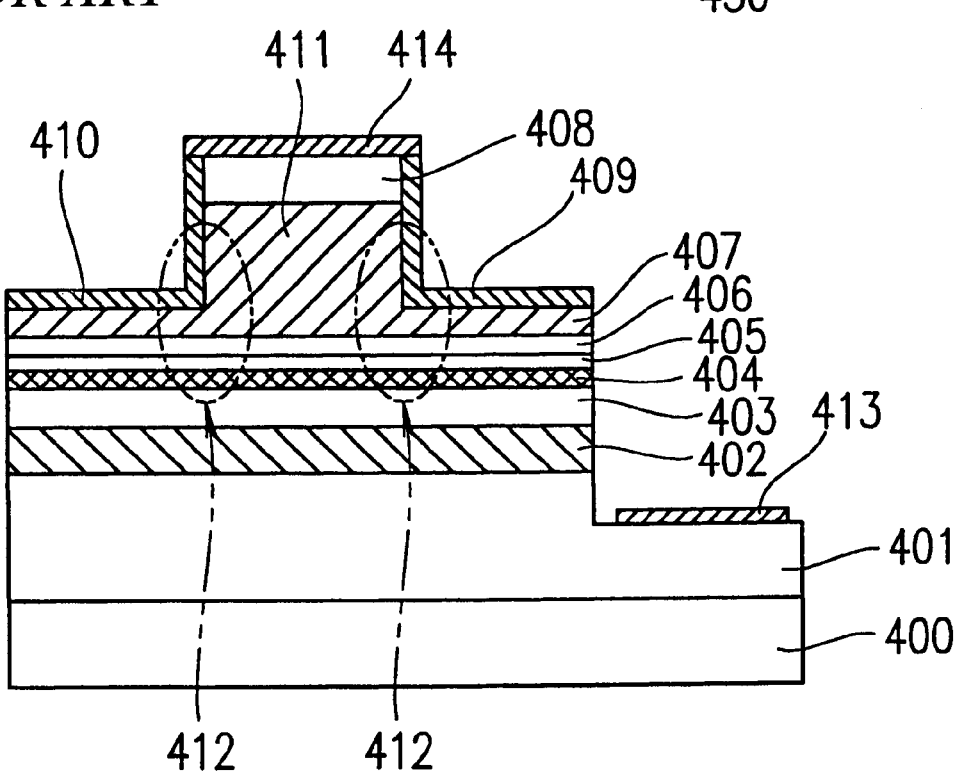
FIG. 4 is a structural view of a conventional laser device.

As described above regarding the method for producing the laser device 150 in this example, when a physical reaction by ion irradiation such as RIE or the like is used as at least a part of the etching function for forming the ridge stripe portion 110, it is very difficult to leave the unetched portion of the p-type lower cladding layer 105 (flat region) to have a uniform thickness with a satisfactory controllability to realize a dispersion in the order of 0.01 μm. There is an undesirable possibility that the characteristics of the laser optical waveguide are significantly varied by the non-uniformity in the thickness. However, according to the present invention, the Al-mix crystal ratio of the p-type lower cladding layer 105 is made substantially equal to the Al-mix crystal ratio of the n-type current-constricting layer 109. In this case, even a variation or non-uniformity in the range of 0.1 μm to 0.2 μm in the etching depth (i.e., the thickness of the flat region 111) does not significantly influence the characteristics of the laser device 150. Thus, laser devices having substantially equal characteristics can be produced. In d usual laser device, the composition of the p-type lower cladding layer 105 and the composition of the n-type current-constricting layer 109 are different, and therefore a dispersion in the thickness of the flat region 111 of the p-type lower cladding layer 105 significantly inf luences the characteristics of the optical waveguide. By contrast, the characteristics of the laser optical waveguide in this example are substantially determined by the distance between the multi-layer quantum well active layer 103 and the p-type optical waveguide forming layer 106, the thickness or composition of these two layers, or the composition(s) of the layer(s) provided between the two layers. These parameters are all precisely controllable in the first step of crystal growth. This also provides the following effects. The reliability of the laser device can be improved by the reduction in the thermal distortion at the ridge corners 112, and the yield of the InGaAlN-based semiconductor laser devices using RIE as a main etching means is greatly improved. (In the case of the conventional laser device 450 shown in FIG. 4, the yield of devices having satisfactory initial characteristics is 24%. In the case of the laser devices 150 shown in FIG. 1, the yield is improved to 67%.)

The thickness of the p-type optical waveguide forming layer 106 in this example is 0.15 $\mu$m. When the thickness is changed in the range from 0.03 $\mu$m to 1.5 $\mu$m, laser devices which are satisfactory both in the life and the astigmatic difference are obtained. When the thickness of the p-type optical waveguide forming layer 106 is less than 0.03 $\mu$m, the effective refractive index of the ridge stripe portion 110 is substantially equal to that of the lower flat region 111 (the difference in the effective refractive index between the ridge stripe portion 110 and the lower flat region 111 is $1 \times 10^{-3}$ or less, 0 or less). Thus, the waveguide mechanism is mainly By like gain guide. Therefore, the astigmatic difference is as large as 10 $\mu$m or more, which causes the problems that the beam cannot be focused to a diffraction limit and that the oscillation in a stable fundamental transverse mode is not realized at a high output. When the thickness of the p-type optical waveguide forming layer 106 is more than 1.5 $\mu$m, the waveguided laser light is concentrated on the p-type optical waveguide forming layer 106. Therefore, the laser light intensity in the multi-layer quantum well active layer 103 is relatively reduced, thereby raising the threshold current value: and the total height of the ridge stripe portion 110, which is a current path having a width of as narrow as 2 $\mu$m. becomes 2 $\mu$m or more, thereby raising the device resistance to 20 $\Omega$ or more. Due to these two phenomena, the life of the device is reduced to less than 100 hours.

In the above-described example, the distance between the p-type optical waveguide forming layer 106 and the multi-layer quantum well active layer 103 is 0.475 $\mu$m. The distance can be in any range to which light generated by the multi-layer quantum well active layer 103 expands. Specifically, the distance can be in the range of 0.2 $\mu$m to 1 $\mu$m.

The p-type optical waveguide forming layer 106 can have any composition which does not absorb light generated by the multi-layer quantum well active layer 103 and which has a refractive index larger than that of the current-constricting layer 109. The In-mix crystal ratio thereof is not limited to 0.1 as described in this example. For example, in this example, $In_{0.2}Ga_{0.6}N$ is used as the well layers of the multi-layer quantum well active layer 103. The In-mix crystal ratio of the p-type optical waveguide forming layer 106 can be anything in the range of 0.02 or more and 0.18 or less. When the In-mix crystal ratio of the p-type optical waveguide forming layer 106 is more than 0.18, the p-type optical waveguide forming layer 106 absorbs the light generated in the multi-layer quantum well active layer 103 and the effective refractive index in the ridge stripe portion 110 is smaller than that of the lower flat region 111. Therefore, the threshold current value of the laser device is increased, which causes an inconvenience that, for example, the wavefront of the output laser light is curved. When the In-mix crystal ratio of the well layers of the multi-layer quantum well active layer 103 is changed, a similar effect is provided as long as the p-type optical waveguide forming layer 106 is formed so as to have an In-mix crystal ratio which is 90% or less with respect to that of the well layer. By forming the p-type optical waveguide forming layer 106 of InGaN (in-mix crystal ratio =0.02 to 0.18) and inserting the p-type optical waveguide forming layer 106 between the p-type lower cladding layer 105 and the p-type upper cladding layer 107, the crystal breakage occurring in the crystal growth step of the p-type upper cladding layer 107 can be reduced. This is a result of the crystal distortion between the p-type lower cladding layer 105 and the p-type upper cladding layer being alleviated by the p-type optical waveguide forming layer 106 formed of InGaN.

In consideration of the function played by the p-type optical waveguide forming layer 106, the p-type optical waveguide forming layer 106 can be formed of AlGaN having a smaller Al-mix crystal ratio than that of the n-type current-constricting layer 109, Instead of InGaN. In this case, however, the effect of suppressing the crystal breakage in the p-type upper cladding layer 107 cannot be observed.

By limiting the materials of the p-type lower cladding layer 105 forming the ridge corners 112 and the vicinity thereof, the n-type current-constricting layer 109, and the p-type optical waveguide forming layer 106 as described above, a gallium nitride-based semiconductor laser having a long life and outputting light having a plane wavefront can be realized.

Example 2

Figure 3:
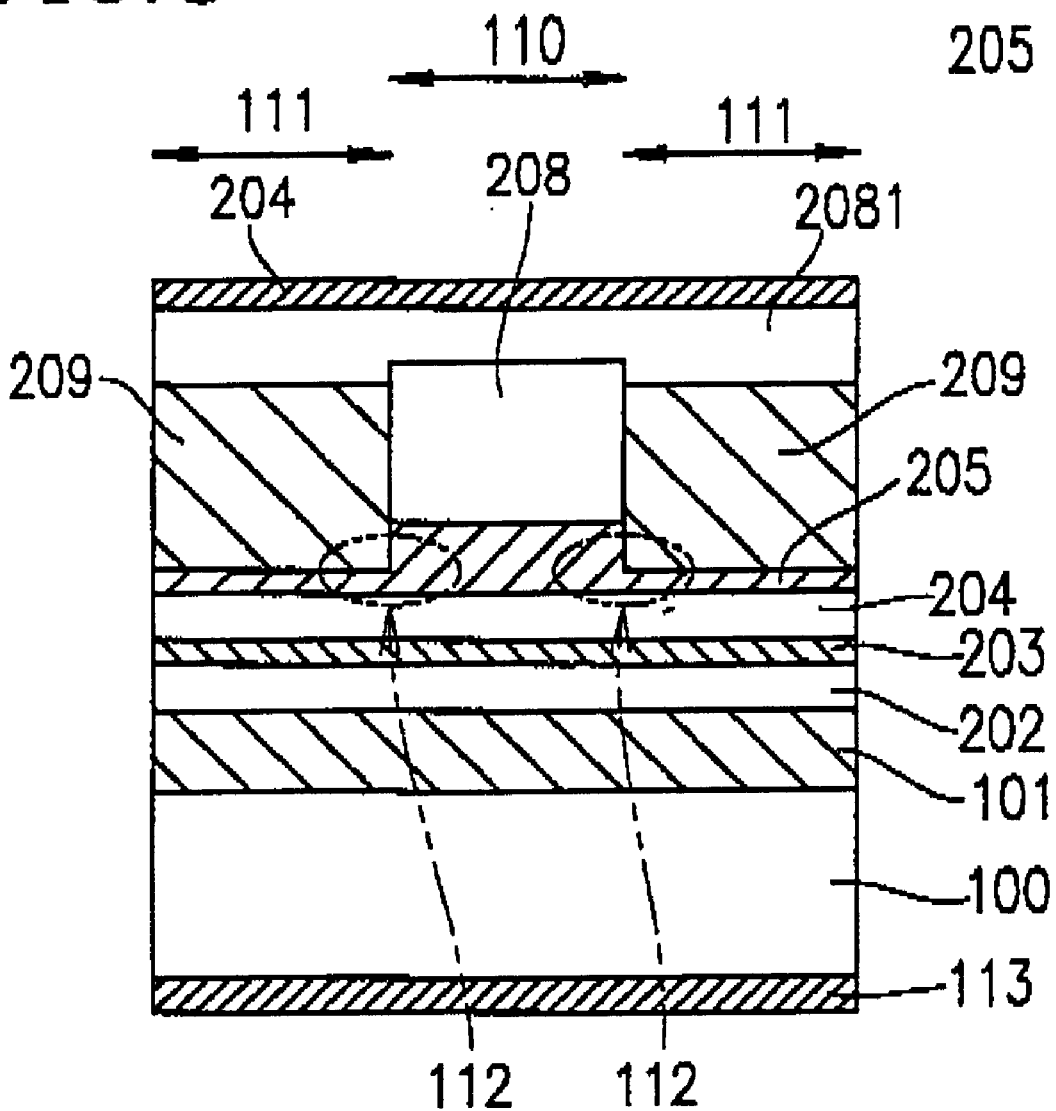
FIG. 3 is a structural view of a laser device in a second example according to the present invention.

FIG. 3 shows a structure of a laser device in this example. The structure is the same as that of the first example until the n-type $Al_{0.1}Ga_{0.9}N$ cladding layer 101 was formed. After that, an n-type $In_{0.05}Ga_{0.95}N$ optical guide layer 202 having a thickness of 0.05 $\mu$m, a multi-layer quantum well active layer 203 including two $In_{0.25}Ga_{0.75}N$ well layers and one $In_{0.03}Ga_{0.97}N$ barrier layer, a p-type $In_{0.05}Ga_{0.95}N$ optical waveguide layer 204 having a thickness of 0.1 $\mu$m, a p-type $Al_{0.13}Ga_{0.87}N$ cladding layer 205 having a thickness of 0.35 $\mu$m, and a p-type GaN contact layer 208 having a thickness of 1.0 $\mu$m were formed by an MOCVD technique. Next, etching was performed in a manner similar to that of the first example, thereby forming a ridge structure having a width of 1.6 $\mu$m and a height of 1.2 $\mu$m. At this point, the dispersion in the etching depth was ±0.1 $\mu$m. Then, an i-type super-lattice current-constricting layer 209 including 35 pairs of an $Al_{0.2}Ga_{0.8}N$ layer having a thickness of 20 nm and containing no impurity and a GaN layer having a thickness of 10 nm was selectively formed on the lower flat region 111 of the p-type cladding layer 205 by a similar method to that in the first example. The $Al_{0.2}Ga_{0.8}N$ layers and the GaN layers were formed alternately, and the i-type superlattice current-constricting layer 209 was formed to have a total thickness of 1.1 $\mu$m. Finally, the mask for selective growing was removed, and then a p-type GaN surface layer 2081 having a thickness of 0.3 $\mu$m was formed on the entirety of the laminate.

Then, a bottom surface of the n-type GaN substrate 100 was ground so that the n-type GaN substrate 100 has a thickness of 30 $\mu$m, and then polished so as to remove grinding scratches. Then, an n-type electrode 113 (similar to that in the first example) was formed on the entire bottom surface of the n-type GaN substrate. Similarly, a p-type electrode 214 was formed on a top surface of the p-type GaN surface layer 2081. The resultant laminate was cleaved to have a resonator length of 450 $\mu$m. thereby producing a laser device 250.

In this example also, the i-type super-lattice current-constricting layer 209 has a super-lattice structure. The average Al-mix crystal ratio thereof was controlled to be substantially the same as that of the p-type cladding layer 205 formed of $Al_{0.13}Ga_{0.87}N$. There is no specific layer corresponding to the p-type optical waveguide forming layer 106 in the first example. Instead, the p-type GaN contact layer 208 is provided 0.4 μm away from the multi-layer quantum well active layer 203 and Is formed of GaN which has a refractive index higher than the average refractive index of the i-type super-lattice current-constricting layer 209. Accordingly, the laser light expands into the p-type contact layer. As a result, the laser light waveguide is realized in the ridge stripe portion 110 In a similar manner to that of the p-type light waveguide forming layer 106 in the first example.

The semiconductor laser device 250 in this example was subjected to a reliability test under the conditions of 60° C. and 30 mW. The life of the device was 10200 hours, which was a significant improvement as compared to the conventional example. In the present example, the wavefront of the laser light is substantially plane, and the astigmatism is within 3 μm, which is sufficiently small to be free of problems in practical use. These effects are provided by the crystal deterioration being suppressed at the ridge corners 112 since the material forming the ridge corners 112 (p-type cladding layer 205) and the material forming the i-type super-lattice current-constricting layer 209 have substantially the same average mix crystal ratio, and thus have substantially the same thermal expansion coefficient from a macroscopic point of view.

The Al-rnix crystal ratio of the p-type cladding layer 205 and the average Al-mix crystal ratio of the i-type super-lattice current-constricting layer 209 are substantially the same as each other. Accordingly, even though the etching depth for forming the ridge stripe portion c10 is dispersed (±0.1 μm in this example), the difference in the effective refractive index between an area of the optical waveguide corresponding to the ridge stripe portion 110 and an area of the optical waveguide corresponding to the lower flat region 111 does not change. Accordingly, the dispersion in far-field images is reduced, and the device oscillates at a stable fundamental transverse mode up to a high output. Thus, the production yield of the device is improved. The production yield of satisfactory devices is 69% in this case.

The following was also found in this example, the p-type GaN contact layer 208 corresponding to the optical waveguide forming layer 106 in the first example is formed of GaN, which has a refractive index smaller than that of the p-type optical waveguide layer 204. This way, the device can oscillate at a threshold current value which is about 5 to 10 mA lower than that of the case where these layers have the same refractive index. As a result a higher reliability can be realized.

The super-lattice structured AlGaN layer for forming the i-type super-lattice current-constricting layer 209 and the GaN layer each preferably have a thickness of 50 nm or less in any case. The reason is that when the thickness of the super-lattice structure is 50 nm or less, the influence of the super-lattice layer on the ridge corners 112 can be considered based on the average composition of the super-lattice structure. When the layer having the super-lattice structure has a thickness of more than 50 nm, the life is only less than 100 hours, which is similar to that of the conventional example.

It was confirmed that the same effect can be provided by replacing the p-type GaN contact layer 208 or the p-type CaN surface layer 2081 with an InGaN layer (In-mix crystal ratio: more than 0 and 0.22 or less).

Example 3

In this example, the n-type cladding layer roland the p-type cladding layer 205 in the second example were each replaced with a super-lattice cladding layer having a thickness of 0.45 μm. The super-lalttice cladding layer includes 30 pairs of an $Al_{0.2}Ga_{0.8}N$ layer having a thickness of 10 nm and a GaN layer having a thickness of 5 nm.

In this case also, the average Al-mix crystal ratio of the p-type cladding layer 205 and the average Al-mix crystal ratio of the i-type super-lattice current-constricting layer 209 are the same. The entire thermal expansion coefficients of the two layers can be considered to be about the same. When the device was subjected to a reliability test under the same conditions as those in the previous examples, a life exceeding 10000 hours was confirmed.

Example 4

In this example, the n-type cladding layer 101 in the first example was replaced with a super-lattice layer having a total thickness of 1.0 μm. The super-lattice layer includes 50 pairs of an $Al_{0.2}Ga_{0.8}N$ layer having a thickness of 10 nm and containing Si, and a GaN layer having a thickness of 10 nm. The p-type lower cladding layer 105 in the first example was replaced with a super-lattice layer having a thickness of 0.4 μm. The super-lattice layer includes 20 pairs of an $Al_{0.2}Ga_{0.6}N$ layer having a thickness of 10 nm and containing Mg, and a GaN layer having a thickness of 10 nm. The p-type optical waveguide forming layer 106 in the first example was replaced with a GaN layer having a thickness of 0.2 μm and containing Mg. The p-type upper cladding layer 107 in the first example was replaced with a super-lattice layer having a total thickness of 0.4 μm. The super-lattice layer includes 20 pairs of an $Al_{0.2}Ga_{0.6}N$ layer having a thickness of 10 nm and a GaN layer having a thickness of 10 nm. The n-type current-constrictlng layer 109 in the first example was replaced with a super-lattice layer having a total thickness of 1.0 μm. The super-lattice cladding layer includes 50 pairs of an $Al_{0.2}Ga_{0.6}N$ layer having a thickness of 10 nm and containing Si, and a GaN layer having a thickness of 10 nm.

In this example also, the p-type lower cladding layer 105 forming the ridge corners 112 and the n-type current-constricting layer 109 formed so as to cover the ridge corners 112 have the same super-lattice structure. Since the average Al-mix crystal ratios of these layers are substantially the same as each other, the thermal expansion characteristics of these layers are substantially the same as each other from a macroscopic point of view. As a result, a life of 9500 hours is obtained.

In the above example, the p-type lower cladding layer 105 and the n-type super-lattice current-constricting layer 109 do not need to have the same super-lattice structure. Specifically, the reliability of the laser device is the same as above even when only the p-type lower cladding layer 105 is replaced with a super-lattice structure including 40 pairs of an $Al_{0.2}Ga_{0.6}N$ layer having a thickness of 5 nm and containing Mg and a GaN layer having a thickness of 5 nm. It was found that even when a super-lattice structure is used, the reliability is significantly improved as compared to the conventional example by making the Al-mix crystal ratio of the layer forming the ridge corners 112 (p-type lower cladding layer 105 in this example) equal to the average Al-mix crystal ratio of the layer forming the ridge corners 112 (n-type lower current-constricting layer 109 in this example).

Example 5

Figure 5:
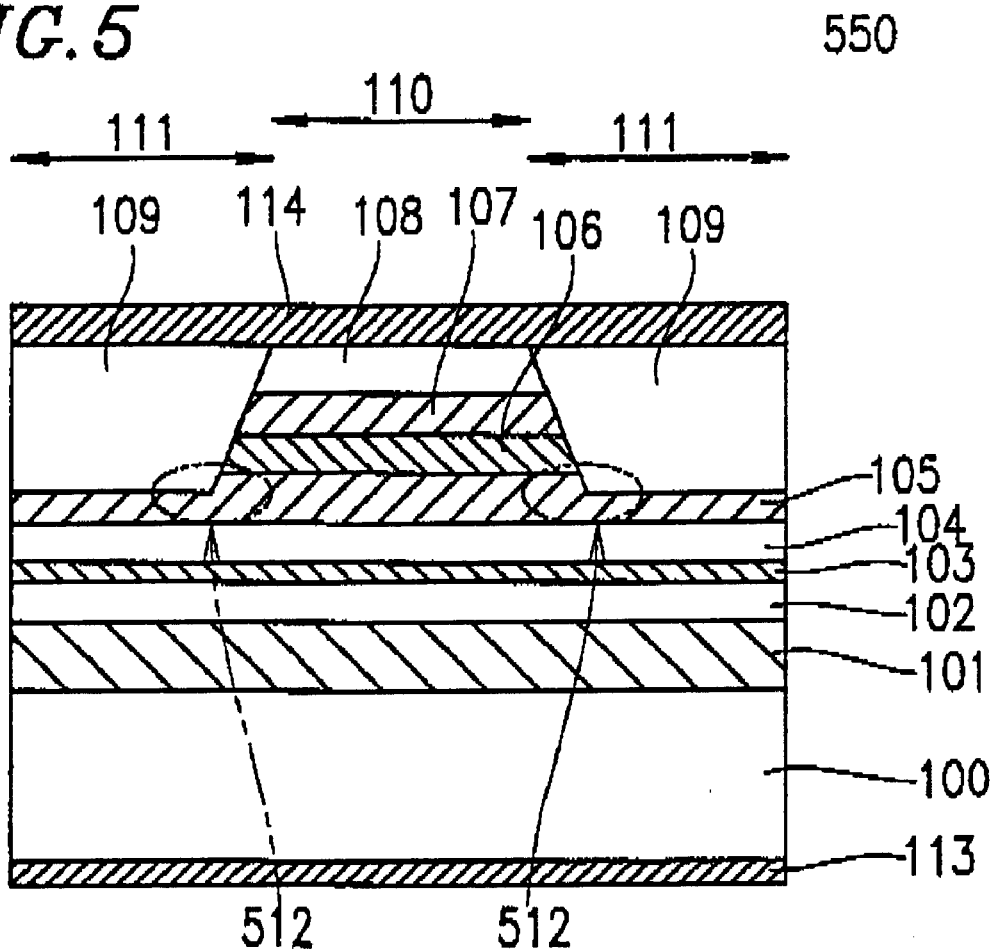
FIG. 5 is a structural view of a laser device in a fifth example according to the present invention.

FIG. 5 shows a cross-sectional structure of a different example. This example is similar to the first example except that an angle of ridge corners 512 made between side surfaces of the ridge and the surface of the lower flat region 111 is 90 degrees or more. Accordingly, the structures and materials which are the same as those of the first example bear the same reference numerals.

By making the angle of the ridge corners 512 100 degrees or more, the range of the Al-mix crystal ratio of the current-constricting layer 109 at which the reliability of 1000 hours is realized can be broader than ±0.04, which is obtained in the case where the material forming the ridge corners 512 is the same as in the first example. Specifically, it was found that a life of 1000 hours or more is realized where the Al-mix crystal ratio of the current-constricting layer is in the range of ±0.08 when the ridge corners 512 is formed of $Al_{0.1}Ga_{0.9}N$ and the angle of the ridge corners 512 is in the range of 100 degrees or more and 130 degrees or less.

The reason is considered to be the following. The crystal defect caused by the thermal distortion generated at the ridge corners 512 is alleviated by making the angle of the ridge corners 512 100 degrees or more. Thus, the propagation of the defect in the direction toward the active layer 103 located below the ridge portion 110 is suppressed. An angle of the ridge corners 512 exceeding 130 degrees is inappropriate for the following reason. Since the inclining surface of the ridge is too gentle to set a steep refractive index difference with respect to the transverse oscillation mode, resulting in an unstable oscillation mods.

It was found that when the angle of the ridge corners 512 is 90 degrees or more and less than lao degrees, the Al-mix crystal ratio of the current-constricting layer 109 needs to be ±0.04 as in the first example, in order to provide the laser device with a life of 1000 hours. From the above, it was found that when the angle of the ridge corners 512 is 90 degrees or more and less than 100 degrees, the difference in the thermal expansion coefficient between the lower cladding layer 105 and the current-constricting layer 109 can be $±2×10^{-9}/°$ C. It was, also found that when the angle of the ridge corners 512 is 100 degrees or more and 130 degrees or less, the difference in the thermal expansion coefficient between the lower cladding layer 105 and the current-constricting layer 109 can be $±4×10^{-9}/°$ C.

In the above-described examples, GaN was used for the substrate. The present invention is not limited to using a GaN substrate. A sapphire substrate used in the conventional example, an SiC substrate or the like can be used. The present invention encomnpasses a structure in which the conductivity types in the above examples are all inverted.

INDUSTRIAL APPLICABILITY

By applying the present invention, a semiconductor laser having a stable oscillation mode and a small threshold current value and thus having a superior reliability can be produced at a high yield.

Using the semiconductor laser device of the present invention, even when the temperature of the device is locally increased in the stripe-shaped projecting structure and the vicinity thereof in which the current is injected in a concentrated manner, the thermal distortion of the device is suppressed owing to the small difference in the thermal expansion coefficient between the current-constricting layer and the second conductive layer. Therefore, a local crystal defect or crystal breakcage is avoided, thus extending the life of the laser device.

In the semiconductor laser of the present invention, the thermal expansion coefficient, which varies depending on the Al-mix crystal ratio, can be less diff serent between the current-constricting layer and the second layer, and thus the thermal distortion of the device can be reduced. By forming the optical waveguide forming layer of $In_uGa_{1-u}N$, the refractive index of the optical waveguide forming layer can be higher than that of the flat region of the second layer on which the current-constricting layer is formed. This way, a laser device stably oscillating in a single transverse mode up to a high output can be obtained. In addition, the wavefront of the output laser beam is substantially plans and the astigmatic difference can be reduced.

In the semiconductor laser of the present invention, the thermal expansion coefficients of the second conductive layer and the current-constricting layer are substantially the same, and thus the crystal deterioration at the ridge corners is suppressed. Therefore, the life of the laser device can be extended. By forming the layer having the super-lattice structure to have a thickness of 50 nm or less, the influence of the super-lattice layer on the ridge corners 112 can be considered based on the average composition of the super-lattice structure.

What is claimed is:

1. An InGaAlN-based semiconductor laser device, comprising a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure; a stripe-shaped optical waveguide forming layer of the second conductivity type having a larger refractive index at the wavelength of the laser light emitting at the active layer than that of the second layer is formed on the stripe-shaped projecting structure; a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the current-constricting layer and a thermal expansion coefficient of the second layer is in the range of $-4×10^{-9}/°$ C. to $+4×10^{-9}/°$ C., wherein an InGaAlN layer included in a super-lattice structure forming the second layer or the current-constricting layer has a thickness of 50 nm or less.

2. A semiconductor laser device according to claim 1, wherein the second layer and the current-constricting layer are formed of an InGaAlN-based semiconductor material of a same composition.

3. A semiconductor laser device according to claim 1, wherein the second layer is formed of $Al_xGA_{1-x}N$, the current-constricting layer is formed of $Al_yGa_{1-y}N$, and $-0.08 ≤ x-y ≥ 0.08$.

4. A semiconductor laser device according to claim 3, wherein an angle made between the flat region and a ridge corner formed by the stripe-shaped projection structure is between 100 degrees and 130 degrees inclusive.

5. An InGaAlN-based semiconductor laser device, comprising a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure;

a stripe-shaped optical waveguide forming layer of the second conductivity type having a larger refractive index than that of the second layer is formed on the stripe-shaped projecting structure;

a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the current, constricting layer and a thermal expansion coefficient of the second layer is in a range of $-4 \times 10^{-9}/°C$. to $+4 \times 10^{-9}/°C$., wherein the second layer and the current-constricting layer are formed of an InGaAlN-based semiconductor material of a same composition, wherein the second layer is formed of $Al_xGa_{1-x}N$, the current-constricting layer is formed of $Al_yGa_{1-y}N$, and $-0.08 \leq x-y \leq 0.08$, and wherein an angle made between the flat region and a ridge corner formed by the stripe-shaped projection structure is 90 degrees or between 90 degrees and 100 degrees, and $-0.04 \leq x-y \leq 0.04$.

6. An InGaAlN-based semiconductor laser device, comprising a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure;

a stripe-shaped optical waveguide forming layer of the second conductivity type having a larger refractive index than that of the second layer is formed on the stripe-shaped projecting structure;

a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the current-constricting layer and a thermal expansion coefficient of the second layer is in a range of $-4 \times 10^{-9}/°C$. to $+4 \times 10^{-9}/°C$., wherein the second layer and the current-constricting layer are formed of an InGaAlN-based semiconductor material of a same composition, and wherein the optical waveguide forming layer is formed of $In_uGa_{1-u}N$, u is between 0.02 and 0.18 inclusive and is 90% or less of an In-mix crystal ratio of a well layer included in the active layer.

7. An InGaAlN-based semiconductor laser device, comprising a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure;

a stripe-shaped optical waveguide forming layer of the second conductivity type having a larger refractive index than that of the second layer is formed on the stripe-shaped projecting structure;

a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the current-constricting layer and a thermal expansion coefficient of the second layer is in a range of $-4 \times 10^{-9}/°C$. to $+4 \times 10^{-9}/°C$., wherein at least one of the second layer and the current-constricting layer is formed of an InGaAlN-based super-lattice structure, and the second layer and the current-constricting layer have the same average mix crystal ratio.

8. An InGaAlN-based semiconductor laser device, comprising a first layer of a first conductivity type, an active layer having a smaller forbidden band than that of the first layer, and a second layer of a second conductivity type having a larger forbidden band than that of the active layer, wherein the second layer includes a flat region and a stripe-shaped projecting structure;

a stripe-shaped optical waveguide forming layer of the second conductivity type having a larger refractive index than that of the second layer is formed between the flat region and the stripe-shaped projecting structure;

a current-constricting layer of the first conductivity type or of a high resistance is formed for covering a top surface of the flat region of the second layer, a side surface of the projecting structure of the second layer, and a side surface of the optical waveguide forming layer; and a difference between a thermal expansion coefficient of the currentconstricting layer and thermal expansion coefficient of the second layer is in a range of $-4 \times 10^{-9}/°C$. to $+4 \times 10^{-9}/°C$., wherein an InGaAlN layer included in a super-lattice structure forming the second layer or the current-constricting layer has a thickness of 50 nm or less.

* * * * *